United States Patent
Blake

(10) Patent No.: US 10,197,639 B1
(45) Date of Patent: *Feb. 5, 2019

(54) FERROMAGNETIC FASTENER LOCATING DEVICE

(75) Inventor: John Blake, Kennebunk, ME (US)

(73) Assignee: Diamond Resource, LLC, Goffstown, NH (US)

( * ) Notice: Subject to any disclaimer, the term of this patent is extended or adjusted under 35 U.S.C. 154(b) by 840 days.

This patent is subject to a terminal disclaimer.

(21) Appl. No.: 13/309,828

(22) Filed: Dec. 2, 2011

Related U.S. Application Data

(60) Provisional application No. 61/419,286, filed on Dec. 3, 2010.

(51) Int. Cl.
| | | |
|---|---|---|
| *G01R 33/02* | (2006.01) | |
| *G01V 3/08* | (2006.01) | |
| *G01R 19/00* | (2006.01) | |

(52) U.S. Cl.
CPC .............. *G01R 33/02* (2013.01); *G01V 3/08* (2013.01)

(58) Field of Classification Search
CPC ............. G01V 3/15; G01V 3/08; G01R 33/02
USPC .......................................................... 324/67
See application file for complete search history.

(56) References Cited

U.S. PATENT DOCUMENTS

| | | | |
|---|---|---|---|
| 3,541,438 A | 11/1970 | Wadley et al. | |
| 4,310,797 A | 1/1982 | Butler | |
| 4,634,974 A * | 1/1987 | Hunter | 324/228 |
| 4,896,131 A | 1/1990 | Pedlesny et al. | |
| 5,296,806 A | 3/1994 | Hurl, Jr. | |
| 6,087,824 A * | 7/2000 | Shiao | 324/67 |
| 6,229,294 B1 | 5/2001 | Wun | |
| 7,690,124 B1 | 4/2010 | Henry | |
| 2003/0066672 A1 | 4/2003 | Watchko et al. | |
| 2006/0152317 A1* | 7/2006 | Clement | A47G 1/17 335/285 |
| 2010/0202846 A1* | 8/2010 | Borunda | B23B 49/00 408/241 G |

FOREIGN PATENT DOCUMENTS

| | | | |
|---|---|---|---|
| EP | 416162 A1 * | 3/1991 | |
| EP | 0416162 A1 | 3/1991 | |

* cited by examiner

*Primary Examiner* — Patrick Assouad
*Assistant Examiner* — Haidong Zhang
(74) *Attorney, Agent, or Firm* — Mesmer & Deleault, PLLC

(57) ABSTRACT

For locating a ferromagnetic object, a device has a non-magnetic housing with a perimeter wall, a front surface, and a rear surface. The perimeter wall defines a chamber within the housing. A stop element is located within the chamber between the front surface and the rear surface. A magnet element is housed within the chamber and is movable between a resting position, where the magnet element is proximate the stop element, and an active position, where the magnet element is proximate the front surface. The device has a mechanism for returning the magnet element to the resting position in the absence of a ferromagnetic object located proximate the front end of the device.

2 Claims, 10 Drawing Sheets

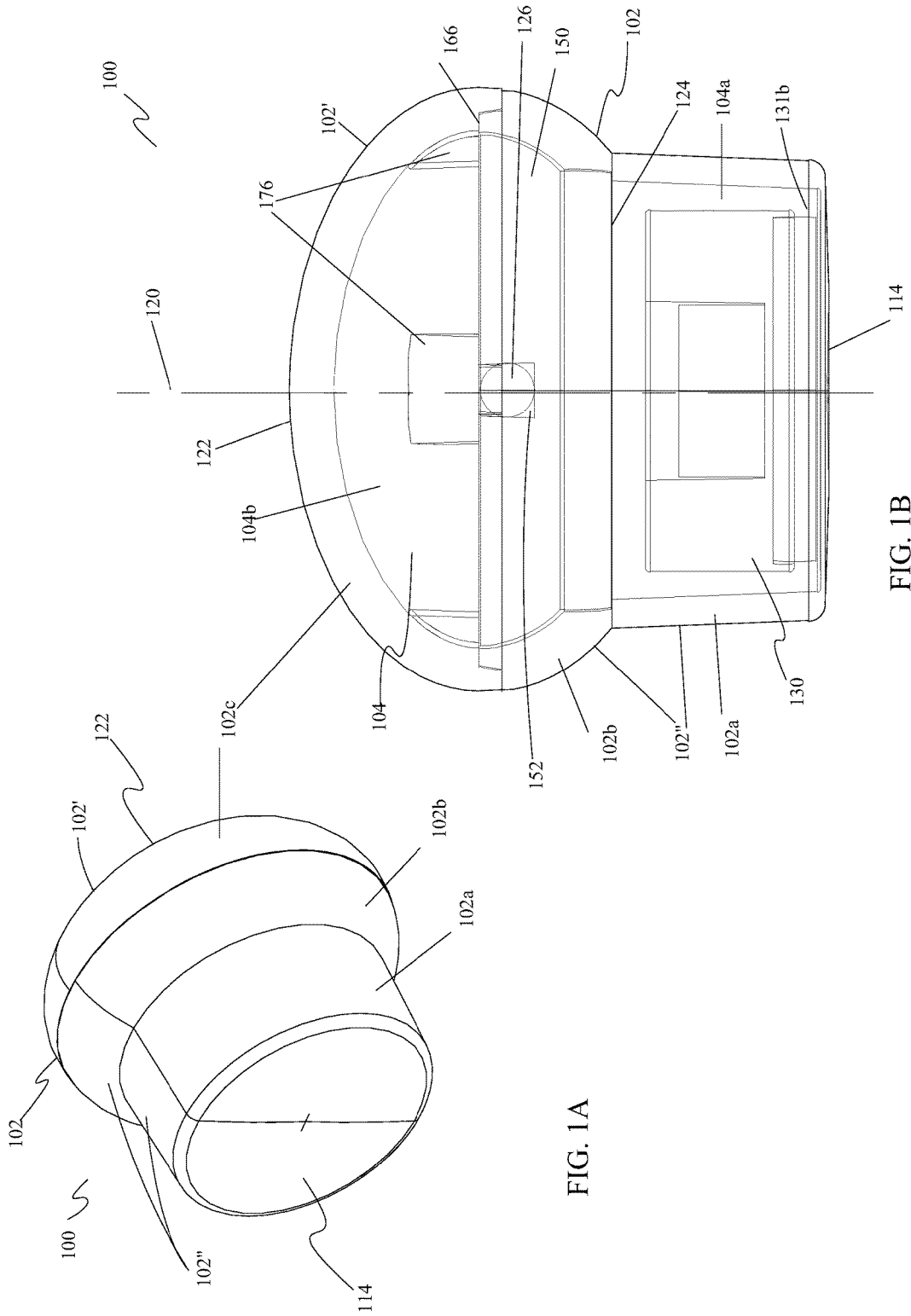

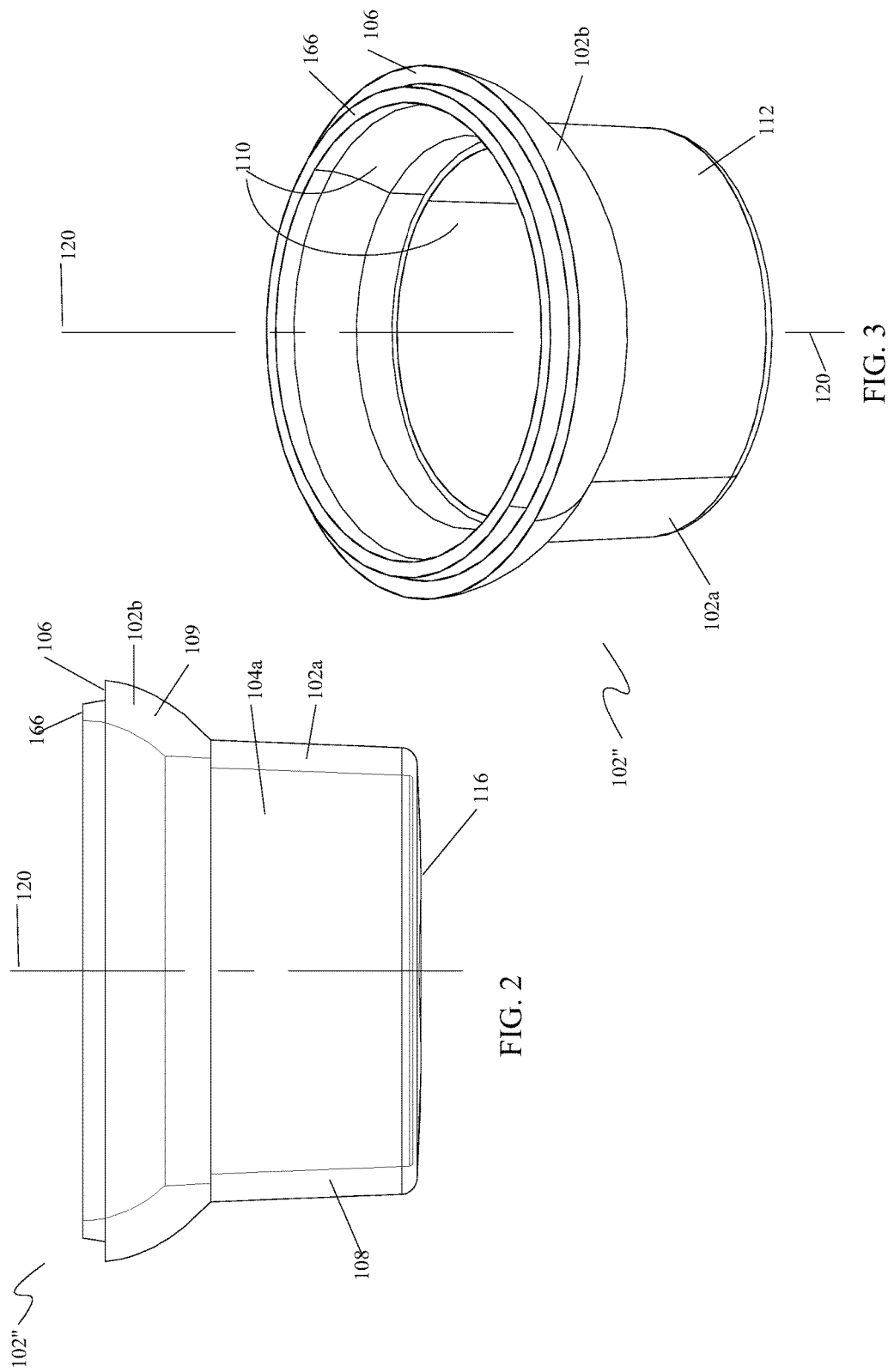

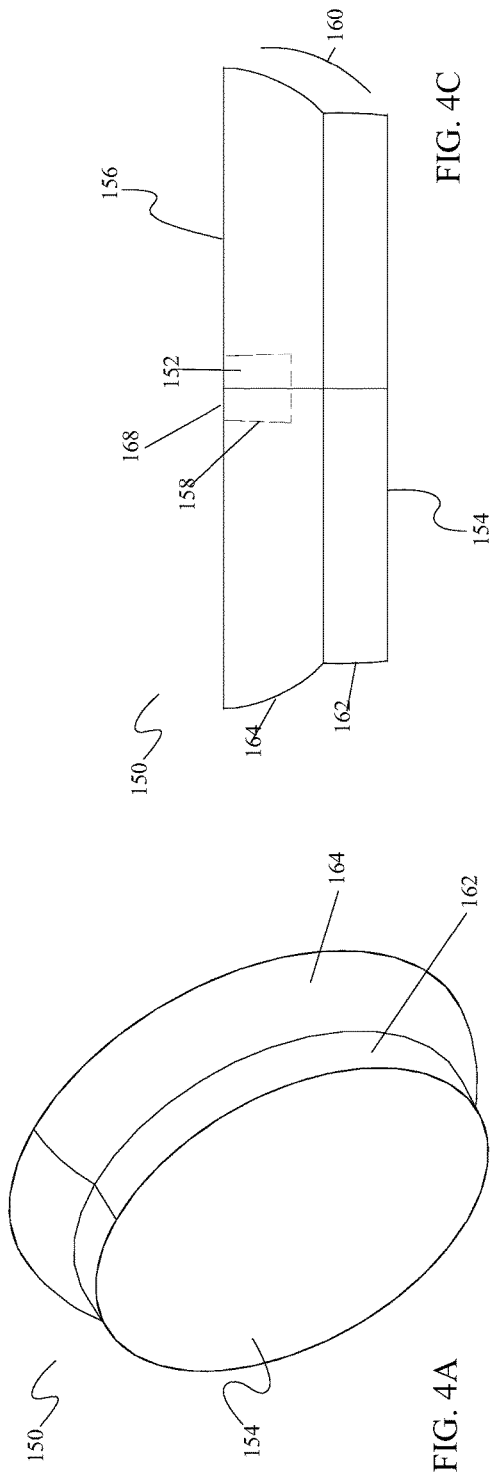

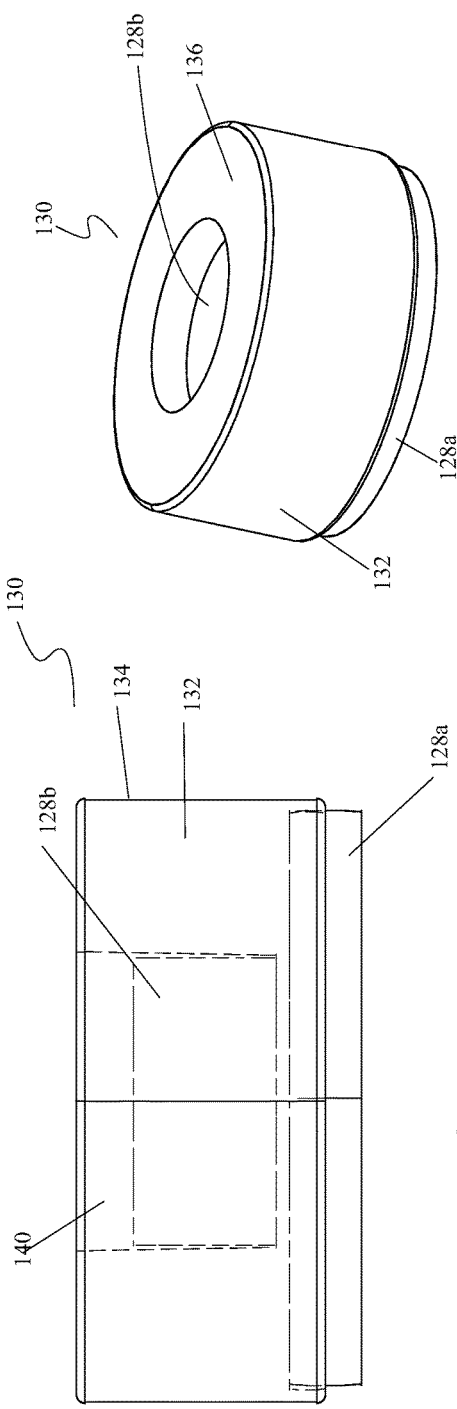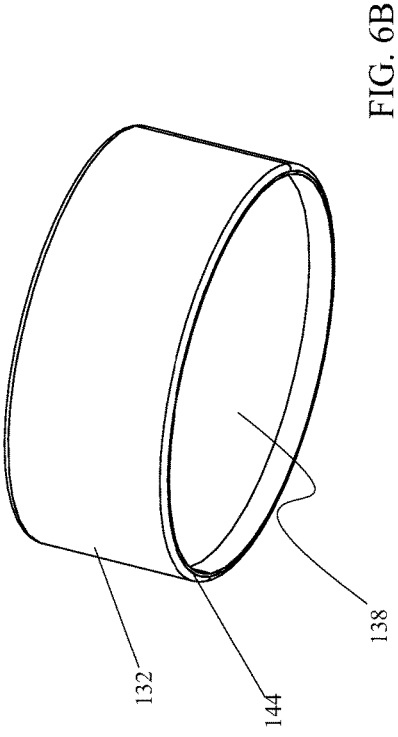
FIG. 6A
FIG. 6B
FIG. 5

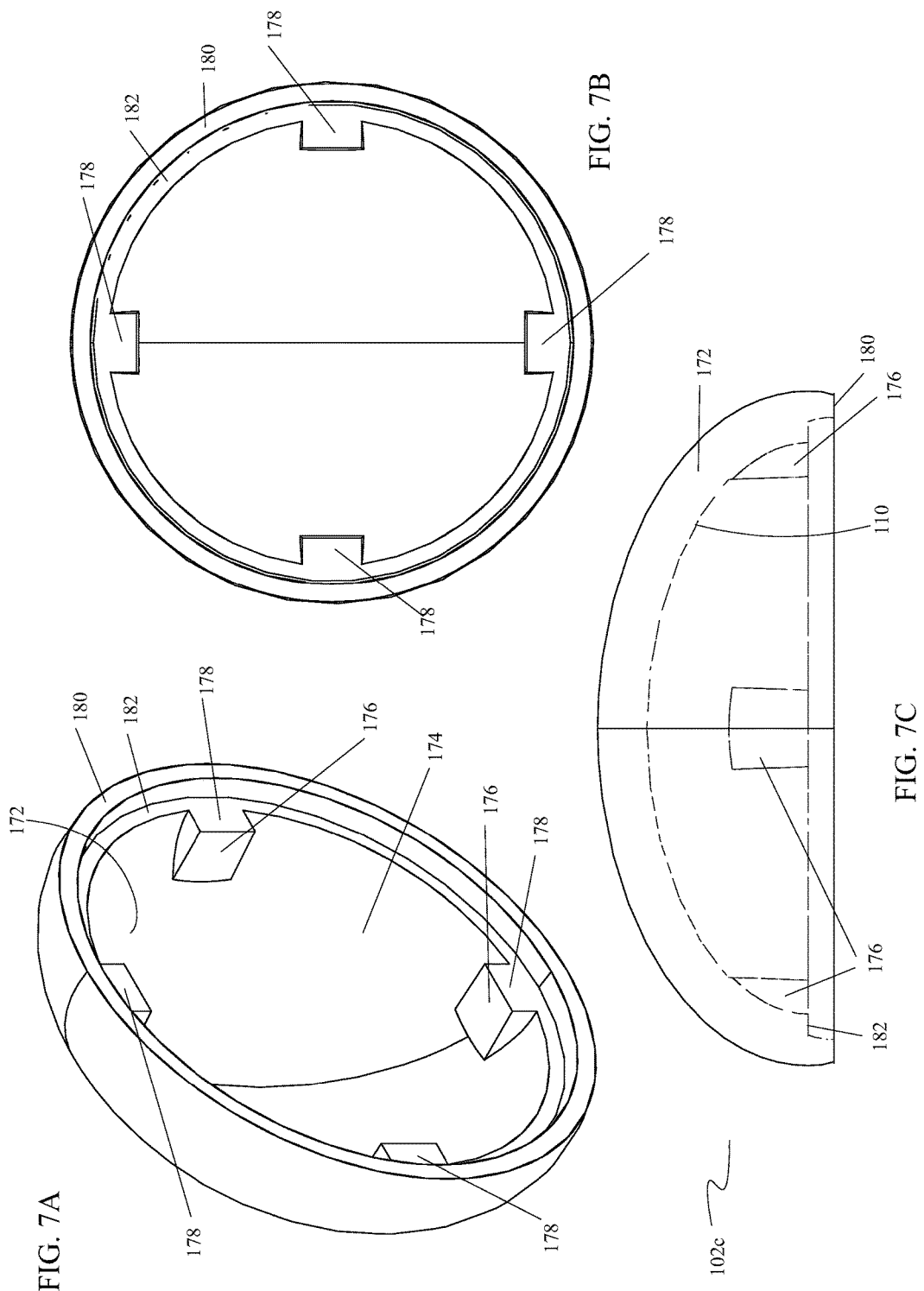

FERROMAGNETIC FASTENER LOCATING DEVICE

This application claims the benefit of U.S. Provisional Patent Application No. 61/419,286, filed Dec. 3, 2010.

BACKGROUND OF THE INVENTION

1. Field of the Invention

The present invention relates generally to hand tools. More specifically, the present invention relates to a device for locating ferromagnetic objects.

2. Description of the Prior Art

It is often necessary to locate structural support members that are hidden behind a wall, ceiling, or floor covering material. These support members include wall studs, floor joists, beams, roof rafters, and strapping. The support members may be wood, as are commonly used in residential construction, or metal, as are commonly used in commercial construction.

Wall or ceiling coverings are secured to structural support members using ferromagnetic fasteners such as screws or nails that are driven through the covering and into the supporting members underneath. For example, drywall sheets are secured with fasteners to framing members as part of a wall or ceiling. These fasteners are concealed with wall compound to finish the surface, thereby concealing the location of the underlying support members.

It is also often necessary to find ferromagnetic fasteners in stand-alone pieces of wood or other non-magnetic substances. For example, prior to using a planer, saw, or other machine on a loose piece of (used) wood, it is desirable to locate ferromagnetic fasteners in the wood to prevent metallic fasteners from causing damage to the machine.

A ferromagnetic material is a material having magnetic properties similar to those of iron. Simply put, one can make a magnet out of a ferromagnetic material. Ferromagnetic materials include iron, nickel, cobalt, and alnico (an aluminum-nickel-cobalt alloy).

During construction, the locations of structural supports are known to the installer in order to properly secure the covering with fasteners. The fasteners are then concealed during the finishing process. It is often necessary to know the location of structural members in order to perform repair work or to securely hang heavy items. One can discover the location of structural members by locating the member itself, or by locating the fasteners attached to structural members.

Locating devices or "stud finders" have been used to locate the presence of structural members within walls and ceilings. Active electronic devices and passive magnetic devices are types of devices used to find structural members in building construction. Active electronic devices use waves that permeate a wall, ceiling, or floor covering. By detecting a change in density when the user moves it from a low density section of wall (no support structure) to a higher density area (possible support structure), these electronic devices indicate the location of a structural member. For active electronic devices to function properly, however, the user must calibrate the device on an area of the wall that does not have support structures (e.g., studs). In other words, the user must calibrate the device over a low density area of the wall.

Passive magnetic devices are relatively accurate since they depend on the fact that most coverings are secured in place by means of metal fasteners that are driven into support members through a wall, floor, or ceiling covering. Since the location of these fasteners is the same as the location of the support structures, magnetic stud finders are used to reveal their location. For example, one device has a housing with pivot bosses to pivotably support a magnet assembly in a location where it can be influenced by the nearby presence of magnetic metals such as steel nails. When the device is out of the magnetic influence of a steel nail, the magnet assembly is rotated to a random angle that remains substantially constant while the user moves the stud finder. When the user moves the stud finder into close proximity to a steel nail, the magnet assembly rotates about the pivot boss until its longitudinal axis points towards the steel nail. The location of the steel nail is verified by moving the stud finder past the steel nail and noting that the magnet assembly rotates to maintain its axis to point towards the steel nail.

SUMMARY OF THE INVENTION

A problem with electronic locating devices is the inherent unreliability caused by variables such as the location where the device is calibrated. This is so because the user generally has no way to know the correct location on the wall to calibrate the device since the user does not know the location of structural members within the wall. Even if the device is somehow calibrated at an ideal low-density location on the wall, the device still may give the user a false indication if it detects an increase in wall density that is due to something other than a support member. Erroneous results may occur if the device detects something such as a pipe, insulation, or simply a change in density of the wall covering itself.

One problem with some magnetic stud sensors is that the method of indication may falsely indicate the location of a stud. Magnetic sensors require very close visual inspection of the indicator because the device can falsely "indicate" if the device is jostled when passed over a bump in the wall surface. For example, consider a device having an indicator that is capable of moving both in response to magnetic attraction to a fastener and in response to gravity or movement. If such a device is used on a textured wall, the indicator may move out of its resting position as a result of vibration as the device passes over the textured surface.

Therefore, what is needed is a device for locating ferromagnetic objects that eliminates the need to calibrate the device for wall density before each use and a device that more reliably indicates the location of a ferromagnetic object.

It is an object of the present invention to provide a device for locating ferromagnetic materials located within a wall, ceiling, floor, or other concealed location.

It is an object of the present invention to provide a device for locating ferromagnetic objects that is capable of producing an audible alert to the user.

It is an object of the present invention to provide a device for locating ferromagnetic materials that is capable of producing a tactile alert to the user.

It is an object of the present invention to provide a device for locating ferromagnetic materials that is capable of producing a visual alert to the user.

It is an object of the present invention to provide a device for locating ferromagnetic objects that operates without electricity or batteries.

It is an object of the present invention to provide a device for locating ferromagnetic objects that improves upon the problems of accuracy and false indications encountered in other locating devices.

It is an object of the present invention to provide a device for locating ferromagnetic materials that eliminates the need to calibrate the device.

The present invention achieves these and other objectives by providing a device to detect concealed ferromagnetic objects by linear movement of a magnet from a resting or first position to an active or second position in response to the ferromagnetic object. In one embodiment of the present invention, a device has a non-magnetic housing with a perimeter wall, a front surface, and a rear surface. The perimeter wall of the housing defines a chamber within the housing. The device has a stop element located in the chamber between the front surface and the rear surface. A magnet element is housed within the chamber and is movable between a resting or first position, where the magnet element is proximate the stop element, and an active or second position, where the magnet element is proximate the front surface. The device also includes a mechanism for returning the magnet element to the resting or first position in the absence of a ferromagnetic object located external to but proximate the front surface.

The mechanism for returning the magnet element to the resting position may be magnetic attractive force, elastic force, and/or pneumatic force. In the case of magnetic attractive force, the magnetic attractive force may result from the presence of a ferromagnetic member positioned behind the stop element or closer to the rear surface to attract the magnet element to the resting position. To signal detection of an object, the magnetic attraction of the magnet element to a ferromagnetic fastener or other object is greater than the attraction to the ferromagnetic member in the device. Thus, when the device is moved away from the ferromagnetic fastener, for example, the magnet member is attracted to the ferromagnetic member in the device. In one embodiment, the ferromagnetic member is a steel solid, a plurality of ferromagnetic particles, a magnet, or a combination of various ferromagnetic objects.

In the case of elastic force, the elastic force may result from a spring or elastic material connected between the magnet element and the rear surface. In the case of pneumatic force, the pneumatic force may result from a pressure differential between the chamber and ambient where the pressure differential results from movement of the magnet element towards the active position.

In another embodiment, the magnet element is a magnet assembly that has a magnet holder configured to fit within the chamber. The magnet assembly has a front portion, a rear portion, and one or more magnets attached to the magnet holder. The magnet holder may have one or more recesses on the front and/or rear portion to receive part or all of the magnet(s). The magnet may set partially within and be attached to the front recess of the magnet holder. In another embodiment, the device further includes a second magnet that may be enclosed within the recess in the rear portion of the magnet holder.

In another embodiment, the device includes a disk element, which also functions as the stop element, housed within the chamber. The disk element has a forward surface and a rearward surface with the forward surface being the stop element. The disk element is configured to accept at least a portion of the ferromagnetic member. The stop element in this embodiment is the forward surface.

In another embodiment, the stop element is one or more surfaces extending within the chamber transverse to a longitudinal central axis of the housing.

In another embodiment, the device has a marking material affixed to the magnet assembly. The marking material may be chalk, graphite, lead, ink, and the like. The front surface of the device has an opening through which the marking material may pass when the magnet is in the active position.

In another embodiment, the device housing may be made of acrylic, polyvinyl chloride (PVC), nylon, polycarbonate, or acrylonitrile butadiene styrene (ABS) plastic.

In yet another embodiment, the chamber containing the magnet element may be any shape so long as the cross-sectional shape of the chamber and the magnet element are substantially similar and the chamber permits the free movement of the magnet element within the chamber. The preferred shape is substantially cylindrical.

In another embodiment, the device has at least one sloping surface extending along an interior wall of the housing and spiraling forward towards the front surface. The magnet assembly has at least one protrusion or leg to engage the sloping surface(s), thereby causing the magnet assembly to rotate about the longitudinal central axis as it moves between the resting position and the active position.

In a further embodiment, a method of detecting a ferromagnetic material beneath a surface is disclosed. The method includes providing a device for detecting the ferromagnetic object. The device signals the location of the ferromagnetic object by a magnet moving from a resting position linearly to an active position in response to detecting the ferromagnetic object. The method also includes the steps of placing the device against the surface and moving the device about the surface until the magnet moves from the resting position to the active position.

BRIEF DESCRIPTION OF THE DRAWINGS

FIG. 1A is a front perspective of one embodiment of the present invention.

FIG. 1B is a cross-sectional view of the embodiment in FIG. 1A.

FIG. 2 is a cross-sectional side view of lower housing of the embodiment in FIG. 1.

FIG. 3 is a perspective rear view of the lower housing in FIG. 2.

FIGS. 4A-4B are perspective front and rear views, respectively, of a disk element shown in FIG. 1B.

FIG. 4C is a cross-sectional side view of the disk element in FIG. 4A.

FIG. 4D is a rear planar view of the disk element in FIG. 4B.

FIG. 5 is a cross-sectional side view of a magnet assembly of the embodiment shown in FIG. 1B.

FIG. 6A is a perspective rear view of the magnet assembly shown in FIG. 5.

FIG. 6B is a perspective front view of the magnet holder shown in FIG. 5.

FIG. 7A is a perspective front view of the upper housing shown in the embodiment in FIG. 1B.

FIG. 7B is a front view of the upper housing shown in FIG. 7A.

FIG. 7C is a cross-sectional side view of the upper housing shown in FIG. 7A.

DETAILED DESCRIPTION OF THE PREFERRED EMBODIMENTS

Figure 8:
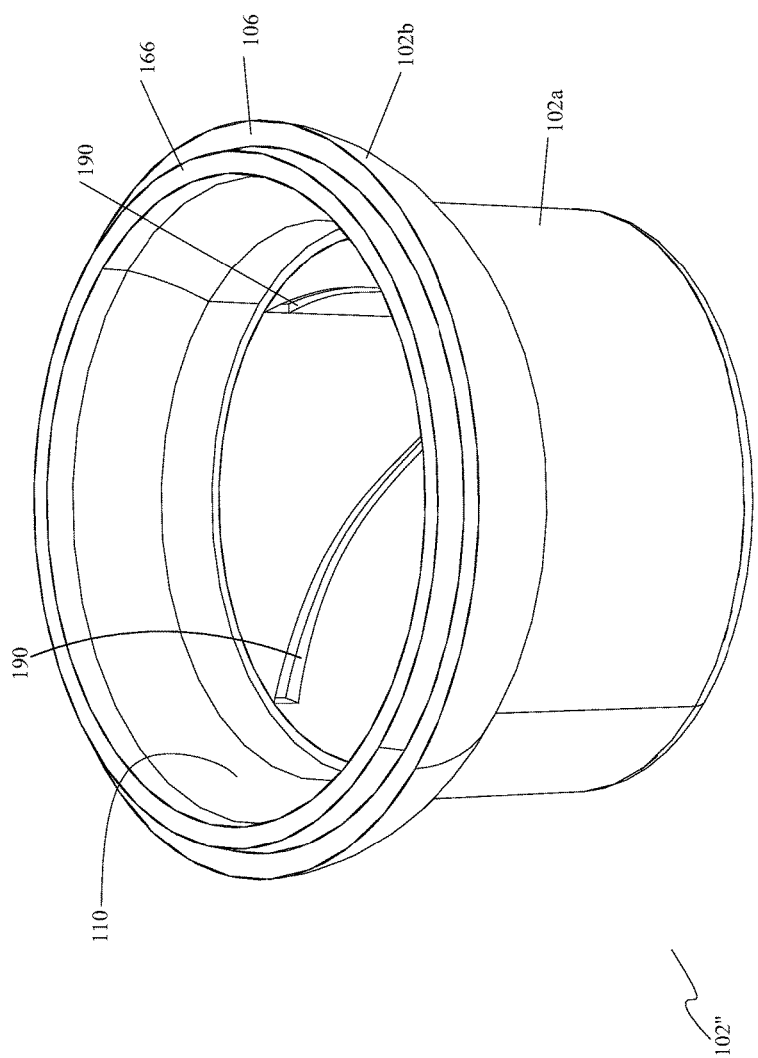
FIG. 8 is a perspective view of another embodiment of the lower housing showing sloping spiral surfaces.
Figure 9:
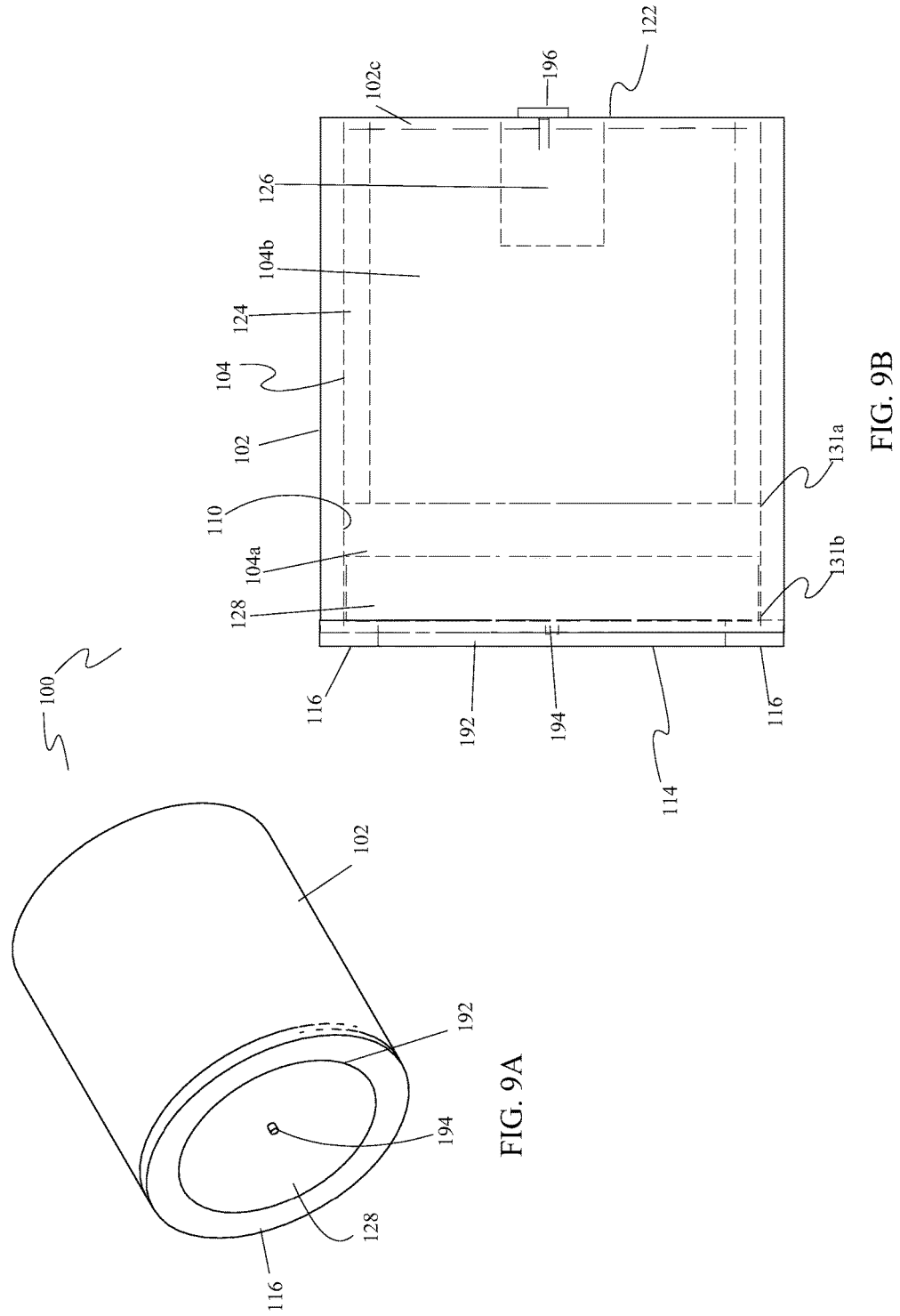
FIG. 9A is a perspective front view of another embodiment of the present invention.
FIG. 9B is a cross-sectional side view of the embodiment shown in FIG. 9A.

The preferred embodiments of the present invention are illustrated in FIGS. 1-12. FIG. 1A is a front perspective view of one embodiment of the present invention showing a device 100 for locating a ferromagnetic material. Device 100 includes a housing 102 having an upper housing 102', a lower housing 102", a front end 114, and a rear end or surface 122. Lower housing 102" has a cup portion 102a, a bowl portion 102b, a perimeter wall 108, and a front planar surface 116. Upper housing 102' has a dome portion 102c forming a rear cap for housing 102". Housing 102 is made of a non-magnetic material such as acrylic, acrylonitrile butadiene styrene (ABS) plastic, polyvinyl chloride (PVC), natural nylon, polycarbonate, other plastics, and non-magnetic metals. Preferably, housing 102 is made of an optically clear acrylic.

Turning now to FIG. 1B, there is illustrated a cross-sectional view of device 100 showing the various internal components of the preferred embodiment. Housing 102 defines an internal chamber 104 that includes a front portion 104a of chamber 104 and a rear portion 104b of chamber 104. Enclosed within chamber 104 of housing 102 are a magnet assembly 130, a disk element 150, and a ferromagnetic member 126. Housing 102 has a central, longitudinal axis 120 that extends perpendicular to front surface 116. A major portion 150a of disk element 150 is positioned within lower housing 102" with a minor portion 150b positioned within upper housing 102'. Disk element 150 is retained in a fixed position within housing 102 by upper housing 102' and encloses a volume within lower housing 102" that is front chamber 104a between disk element 150 and front end 114 of lower housing 102". Magnet assembly 130 is located within chamber 104a in lower housing 102" and moves between a first position 131a (not shown, but is adjacent to disk element 150) and a second position 131b (as shown in FIG. 1B) in a linear direction along central longitudinal axis 120. Ferromagnetic member 126 is securely held within an opening 152 (described below) in disk element 150. Disk element 150 has a surface (described below) that serves as a stop element 124 for magnet assembly 130 when magnet assembly 130 is in first position 131a.

Ferromagnetic member 126 may have any shape so long as its ferromagnetic properties are sufficient to be attracted by a magnet. In the preferred embodiment shown in FIG. 1B, ferromagnetic member 126 is a steel ball housed within disk element 150.

Turning now to FIGS. 2 and 3, there is illustrated cross-sectional and rear perspective views, respectively, of lower housing 102". Lower housing 102" includes cup and bowl portions 102a, 102b. Cup portion 102a preferably has a substantially cylindrical shape with a perimeter sidewall 108 and a solid front surface 116. In the embodiment shown in FIGS. 2-3, lower housing 102" has an inside wall surface 110 that has a shape similar to outside wall surface 112. It should be noted, however, that the shape of inside wall surface 110 may differ significantly from the shape of outside wall surface 112.

Bowl portion 102b has a perimeter ridge 166 and perimeter ledge 106 to engage corresponding surfaces on the dome portion (discussed later). A perimeter ledge 106 extends along the rear perimeter of bowl portion 102b. A perimeter ridge 166 extends in a rearward direction from ledge 106 and is inset towards the central axis 120 from the ledge 106. As shown in FIGS. 2-3, the perimeter ridge 166 may be a continuation of the inside wall surface 110 and may have a smaller radius than ledge 106. For ease of manufacture, perimeter sidewall 108 of cup portion 102a may taper slightly outward from central axis 120 as perimeter sidewall 108 extends rearward towards bowl portion 102b. Bowl portion 102b is preferably formed as one piece with cup section 102a creating a single, unitary lower housing 102".

Bowl portion 102b may have a modified annular shape with an arcuate sidewall 109 that flares outwardly from perimeter sidewall 108 in a rearward direction. Bowl portion 102b creates a portion of chamber 104 that accepts disk element 150. This portion of chamber 104 makes up part or all of rear chamber 104b. The flare has a rounded profile in one embodiment but it may also extend from central axis 120 at a predefined angle. In yet another embodiment, bowl portion 102b may be annular and have a straight sidewall 108. Although the preferred embodiment illustrated shows an outer diameter of bowl portion 102b as being greater than the outer diameter of cup portion 102a, it is noted that bowl portion 102b may have an outer diameter that is smaller than, equal to, or greater than the outer diameter of cup portion 102a.

Bowl portion 102b of lower housing 102" may be formed as one piece with cup portion 102a. Alternately, cup and bowl portions 102a, 102b may be separate pieces and integrally connected to each other.

FIGS. 4A-4D illustrate disk element 150. Disk element 150 is a generally flat, round, disk-shaped member with a forward surface 154, but it could have other shapes, depending on the overall design and shape of device 100. Front surface 154 of disk element 150 serves as stop element 124 that limits movement of magnet assembly 130 towards rear end 122 of device 100. In other embodiments, stop element 124 may be a protrusion, ridge, block, or other restriction on the inside wall surface 110 of housing 102 that prevents magnet assembly 130 from moving towards rear end or surface 122 of device 100 beyond a specified point.

In the embodiment illustrated in FIG. 4B, disk element 150 has an opening 152 in a rear surface 156 to accept ferromagnetic member 126. Opening 152 may be a substantially cylindrical bore extending partially into disk element 150, and have a tapered sidewall 158 that creates a restricted diameter of opening 152 at rear surface 156. A ball 126 (not shown) or other ferromagnetic object may be positioned into bore 152 and held in place by pressure from the restricted diameter 168 of opening 152, which prevents ball 126 from freely exiting from rear surface 156. In another embodiment, a plug, adhesive, or molten polymer may be used in opening 152 to retain ferromagnetic member 126. In other embodiments, ferromagnetic member 126 may be adhered to surface 156 of disk element 150. Ferromagnetic member 126 may also be contained or molded into the interior of disk element 150 or in surface 156. In another embodiment, opening 152 may extend completely through disk element 150. It is contemplated, however, that ferromagnetic member 126 may be adjacent to disk element 150 and not necessarily housed by disk element 150. The ferromagnetic member 126 may be a plurality of ferromagnetic objects or particles, or a steel ball, a magnet, or other ferromagnetic item that is magnetically attracted to a magnet.

In one embodiment, disk element 150 has a sidewall 160 with a straight section 162 and a flared section 164. Other sidewall profiles 160 may also be used. The sidewall 160 illustrated in FIG. 4C permits disk element 150 to reside within the corresponding shape of bowl portion 102b. Thus, disk element 150, and therefore the ferromagnetic member 126, is retained at a fixed distance from front end 114 of device 100.

In other embodiments, disk element 150 may simply be a flat, cylindrical disk with straight sides. In such a configuration, disk element 150 may be retained by a protrusion, fastener, reduced chamber diameter, or other stop element positioned within housing 102. Disk element 150 is preferably made from optically clear acrylic, but may also be made of acrylonitrile butadiene styrene (ABS) plastic, polyvinyl chloride (PVC), natural nylon, polycarbonate, other plastics, or other materials. It is also contemplated that ferromagnetic member 126 may be formed as disk element 150 and thereby reduce the number of components.

Straight portion 162 of disk element 150 has a preferred diameter of about 1.25 inches and height of about 0.15 inches. The diameter of rear surface 154 of the disk element 150 is about 1.5 inches. The overall thickness of disk element 150 is about 0.5 inch. Flared portion 164 may have a curved, arcuate side-view profile that increases in diameter as it extends towards rear surface 156. Flared portion 164 may also have a straight, conical profile that increases in diameter from the point at which it meets the straight portion 162 to rear surface 156. Sidewall 160 may have a side-view profile that is straight (e.g., extending generally perpendicular to the forward and rearward surfaces 154, 156), angled, curved, or a combination of various profile shapes depending on the preferred design and shape of device 100.

Magnet assembly 130 is illustrated in FIGS. 5 and 6A-B. As illustrated in this embodiment, magnet assembly 130 has a magnet holder 132 and at least one magnet 128b. Magnet holder 132 has a generally cylindrical shape and contour that corresponds to the cross-sectional contour of front chamber 104a. The contour of magnet holder 132 may have other contours, such as a rectangle, oval, trapezoid, irregular shape, etc., but should generally correspond to, or be shaped to freely move between first position 131a and second position 131b, in a predefined linear direction, within the contour of front chamber 104a. Magnet holder 132 includes a rear recess 140 and a front recess 138. A magnet 128b is affixed to, formed within, or otherwise held within rear recess 140 of magnet holder 132. Rather than occupying rear recess 140, magnet 128b could also be affixed to the surface of magnet holder 130. Magnet assembly 130 fits within front chamber 104a and is movable between first position 131a (i.e. resting position) (not shown) and second position 131b (i.e. an active position) (not shown). In resting position 131a, magnet assembly 130 is proximate to or resting against stop element 124. In active position 131b, magnet assembly 130 is proximate or against front end 114 of housing 102. In another embodiment, magnet assembly 130 may consist solely of a magnet 128b without the need for magnet holder 132.

In the preferred embodiment, forward and rearward recesses 138, 140 contain magnets 128a, 128b, respectively. One magnet may be sufficient for operation of device 100. Nonetheless, it has been determined experimentally that a larger, thinner magnet 128a housed in forward recess 138 in combination with a smaller, thicker magnet 128b housed within rearward recess 140 is easier to manufacture and provides better control over the counteractive forces at play in the device 100. In one embodiment, larger, thinner magnet 128a protrudes from forward recess 138 beyond crown 144 of the sidewall 134. In contrast, smaller, thicker magnet 128b resides below rearward surface 136 of magnet holder 132.

In one embodiment, magnet holder 132 is about 0.4 inch in thickness from front to back, has an outer diameter of 1.1 inches, a forward recess 138 of about 1.0 inch diameter, a rearward recess 140 of about 0.5 inch diameter, and a thickness of about 0.015 inch between forward and rearward recesses 138, 140. Magnet holder 132 is preferably made of optically clear acrylic, but may also be made of acrylonitrile butadiene styrene (ABS) plastic, polyvinyl chloride (PVC), natural nylon, polycarbonate, other plastics, or other materials. Sidewall(s) 134 is preferably straight and flat with no bulging or depressions, and should be relatively smooth, with no burrs or protrusions to enable free, non-binding movement within chamber 104a.

Turning now to FIGS. 7A-7C, there is illustrated one embodiment of upper housing 102'. In this embodiment, upper housing 102' has a dome shape to provide ergonomic benefits when device 100 is handled. Upper housing 102' (i.e. cap) connects to bowl portion 102b to retain disk element 150 within bowl section 102b. In other embodiments, such as shown in FIGS. 9A-9B, for example, dome portion 102c may also be a simple cover or rear cap 102c that is formed as one piece with, or attaches to, housing 102.

As shown in FIG. 7A, upper housing 102' has an inside, dome-shaped surface 172 with one or more protrusions 176. Protrusions 176 have a block shape with a flat surface 178. Flat surface 178 on the forward end of each protrusion 176 is continuous with recessed rim 182. The plurality of protrusions 176 stabilize the position of the disk element 150. The recessed rim 182 mates with ridge 166 on disk element 150. Similarly, the front perimeter surface 180 of the upper housing 102' mates with the ledge 106 of bowl portion 102b as shown in FIGS. 2-3. It is contemplated that upper housing 102' may be a hemispherical solid with a front surface that would provide the flat surface for stabilizing the position of disk element 150.

Upper housing 102' may be permanently attached to lower housing 102' by solvent welding or melting the material along perimeter 180 and/or recessed rim 182 to fuse it with ledge 106 of bowl portion 102b. In another embodiment, the upper housing 102' may attach to bowl portion 102b or other parts of lower housing 102" by threaded engagement, fasteners, or snap fit, for example. In yet another embodiment, disk element 150 may feature threads on sidewall 160 that mate with threads on interior surface of recessed rim 182 of dome portion 102c. Similarly, all portions of housing 102 may be connected together with threaded engagement, fasteners, snap fit, solvent welding, or fusing the materials together.

Referring to FIG. 8, there is illustrated an alternate embodiment of lower housing 102" that features one or more sloping surfaces 190 along the inside wall surface 110 of chamber portion 102b. Sloping surfaces 190 spiral forward towards front end 114 of device 100. Preferably, two or three spiral surfaces 190 are positioned with equal spacing around inside wall surface 110 of cup portion 102b or housing 102. Each spiral surface 190 may be a groove formed into inside wall surface 110 of housing 102. A leg 220 extending from the magnet holder 132 into the groove guides magnet assembly 132 forward or backward while rotating about the central longitudinal axis of the housing 102. Alternately, surfaces 190 each may be formed as a shelf-like ramp 190 that extends radially inward from inside wall surface 110 of housing 102, like an extended thread.

The purpose of spiral surfaces 190 is to engage a leg 220 or other feature on magnet assembly 130. When device 100 passes over a ferromagnetic object, magnet assembly 130 is rapidly attracted towards front end 114. During its movement towards front end 114, spiral or sloping surfaces 190 guide magnet assembly 130 in a rotating motion towards front end 114 of device 100.

Figure 10:
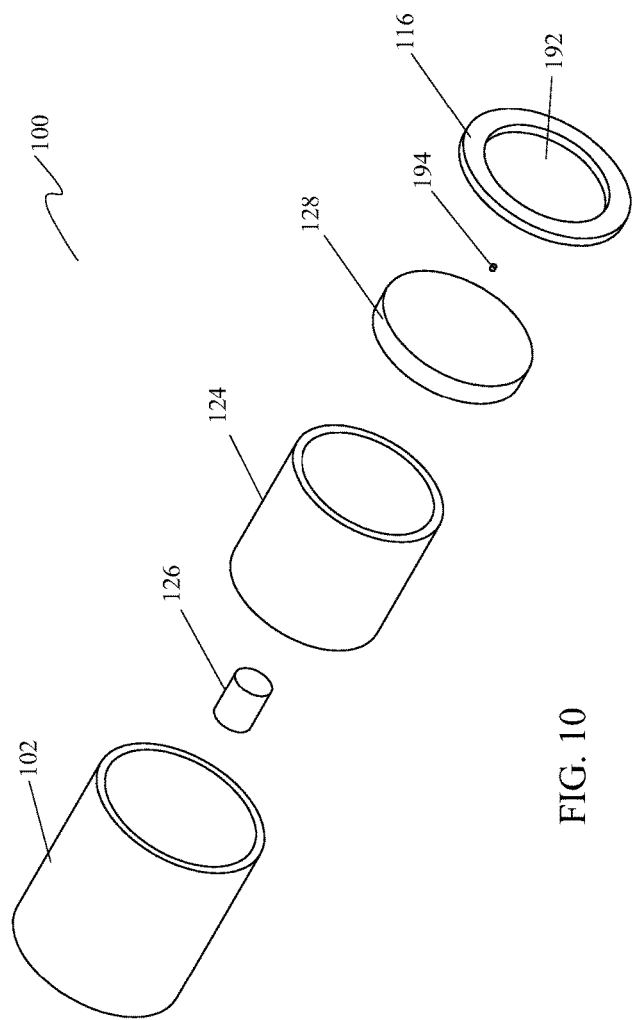
FIG. 10 is a front perspective, exploded view of the embodiment shown in FIG. 9A.

FIGS. 9A, 9B, and 10 illustrate another embodiment of device 100 of the present invention. FIGS. 9A and 9B show perspective and side views of device 100, respectively. FIG. 10 shows a perspective exploded view of the parts of one embodiment of device 100. Device 100 in the embodiment has a non-magnetic housing 102 with an interior chamber 104. Preferably, the housing 102 is a hollow cylinder with a closed end, but the housing 102 may have another shape so long as it is tubular. The device 100 has a front surface 116 and a rear surface 122 or cap 102c. Ferromagnetic member 126, such as a magnet, steel ball, or other ferromagnetic item, may be attached to the rear cap 102c or otherwise retained within rear portion 104b of chamber 104. Ferromagnetic member 126 may be attached by using an adhesive or fastener(s) 196 such as, for example, screw, bolts, rivets, and the like. Housing 102 contains a magnet element 128 in front portion 104a of chamber 104. Magnet element 128 may be a magnet or a magnet assembly 130. Stop element 124 prevents magnet element 128 from moving in the rearward direction beyond a predefined point. Stop element 124 may be one or more blocks or protrusions on or affixed to interior wall surface 110, a ridge on interior wall surface 110, a thickening of interior wall surface 110, a structure (e.g., a pin or plate) passing through housing 102 into chamber 104, or other physical structure that prevents the magnet element 128 from traveling past a predefined position within housing 102. Like front surface 154 of disk element 150 in the embodiment shown in FIG. 1, stop element 124 may be one or more structures positioned in chamber 104 that limits movement of magnet element 128 within the chamber 104.

Stop element 124 may be a structure that passes through sidewall 108 (e.g., a fastener or pin) or a structure that merely occupies a space in chamber 104 to prevent magnet element 128 from moving past stop element 124. In the embodiment shown in FIGS. 9B and 10, Stop element 124 is a hollow cylinder that fits within interior wall surface 110 of housing 102. Stop cylinder 124 has a smaller overall length from front to back than housing 102, thus defining a front portion 104a of chamber 104a (housing magnet element 128) and a rear portion 104b of chamber 104 (housing the ferromagnetic member 126 and stop cylinder 124).

As shown in FIGS. 9A, 9B, and 10, device 100 may optionally comprise a marking material or element 194 attached to magnet element assembly 130. Magnet assembly 130 may have one or more attached marking devices 194 in a location corresponding to opening(s) 192 in front surface 116. Marking device 194 marks the wall or other surface at the location of a ferromagnetic object. The marking device 194 may be, for example, pencil lead, chalk, ink, graphite, and the like.

Device 100 may automatically mark the wall or other surface. The user of device 100 can also manually mark the surface. As shown in FIGS. 9A-9B, for example, an opening 192 on front surface 116 of device housing 102 allows the marking material 194 to pass through opening 192 to scribe the wall or other surface. In combination with sloping surfaces 190 as illustrated in FIG. 8, magnet assembly 130 rotates as it moves to active position 131b to mark the surface. When magnet assembly 130 reaches front end 114, it does so while rotating. Because magnet assembly 130 rotates, marking device(s) 194 that extend slightly past the front surface 116 scribe the wall or other surface when magnet element 128 reaches active position 131b and marking device(s) 194 contact the surface.

Figure 11:
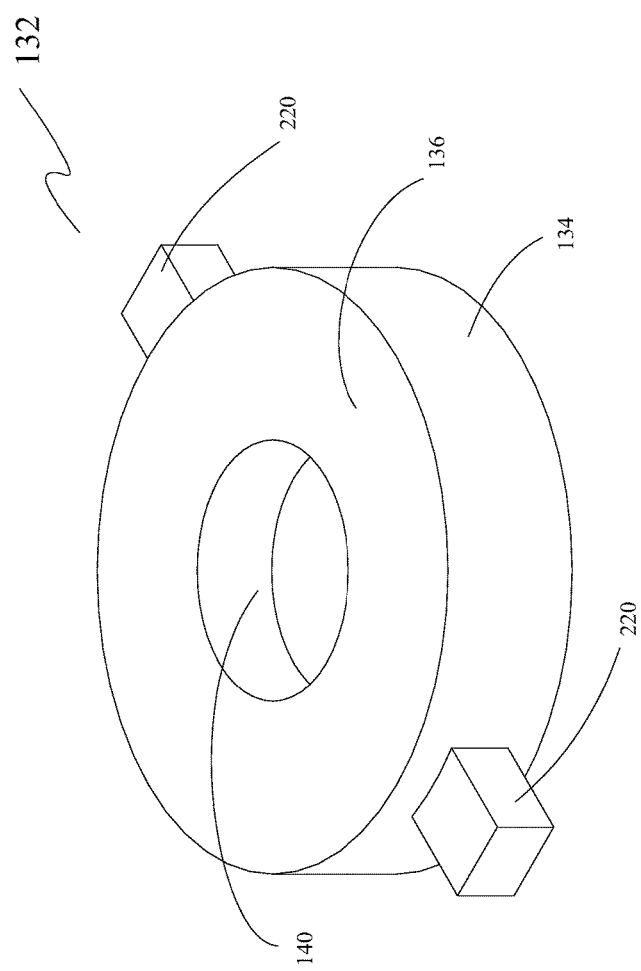
FIG. 11 is a rear perspective view of another embodiment of a magnet holder.
Figure 12:
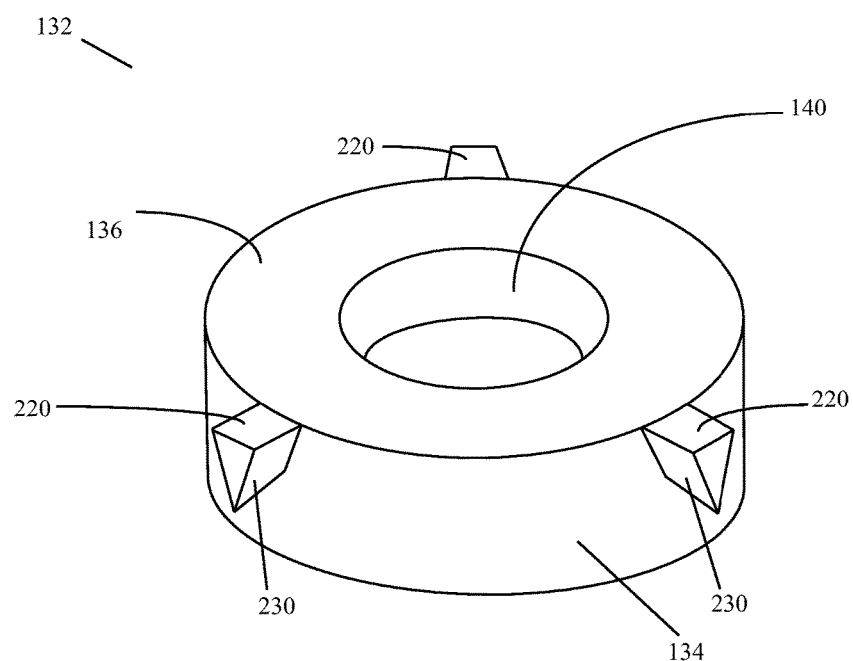
FIG. 12 is a rear perspective view of another embodiment of a magnet holder.

FIGS. 11 and 12 illustrate other embodiments of magnet holder 132. In these embodiments, magnet holder 132 preferably has two or three legs 220 protruding from sidewall 134 of holder 132. Legs 220 are equally spaced around the perimeter of magnet holder 132. In the embodiment illustrated in FIG. 11, two legs 220 are positioned on opposite sides of magnet holder 132, rotationally separated center-to-center by 180 degrees. In the embodiment illustrated in FIG. 12, three legs 220 are rotationally separated center-to-center by 120 degrees. In the embodiments illustrated in either of FIGS. 11 and 12, legs 220 extend from holder 132 to engage sloping surfaces 190 in an alternate embodiment of chamber 102 as illustrated, for example, in FIG. 8, to cause magnet holder 132 to rotate as it moves between first position 131a and the second position 131b. As illustrated in FIG. 11, legs 220 are block-shaped, but may be rounded or angled, and may have chamfered or rounded corners. FIG. 12 illustrates an example of an embodiment of magnet holder 132 with angled legs 220 in which the guiding surface 230 of leg 220 is angled appropriately to engage sloping surface 190 of housing 102. In yet another embodiment of magnet holder 132, legs 220 may engage a shelf-like ramp 190 from above and below to rotate the magnet assembly 130 as it moves between resting position 131a and active position 131b. Such engagement may be achieved, for example, by a slot formed in leg 220.

To assemble device 100 as illustrated in FIG. 1B, magnet assembly 130 is placed into cup portion 102a of lower housing 102". Next, disk element 150 is placed into the cavity formed by the interior of bowl portion 102b. Dome portion 102c or rear cap 102c is then adhered to ledge 106 and/or perimeter ridge 166 of bowl portion 102b, thereby holding disk element 150 in place within bowl portion 102b and magnet assembly 130 within cup portion 102a. Dome portion 102c is not required for device 100 to operate since ferromagnetic member 126 and/or disk element 150 could be held in place by other means.

Rear portion 104b of chamber 104 of device 100 houses ferromagnetic member 126 to retain magnet element 128 in resting position 131a when front end 114 of device 100 is not located close to a ferromagnetic object. In its quiescent or resting state, device 100 works by attracting magnet element 128 away from front of the device 114 until it contacts stop element 124. Stop element 124 is preferably a non-magnetic material positioned within the housing 102 at a fixed distance away from the front 114 of the device. Stop element 124 could also be a magnetic material, and therefore serve as the ferromagnetic member 126, or act in conjunction with the ferromagnetic member 126, provided that the magnetic attraction of magnet element 128 to stop element 124 does not defeat the magnetic attraction of magnet element 128 to a fastener or other ferromagnetic object.

Magnet element 128 is attracted to ferromagnetic member 126 with enough force to keep it in the resting position against stop element 124 while device 100 passes over a surface in search of a fastener. As soon as device 100 is moved over a fastener, steel support member, or other magnetic object, the stronger magnetic attraction to that object pulls magnet element 128 out of its resting position 131a to its active position 131b. Because the strength of the magnetic attraction increases as magnet element 128 moves closer to the fastener, magnet element 128 accelerates towards the fastener at an exponentially-increasing rate. This acceleration produces the quick snap action of magnet element 128 against the front end 114 as it is pulled towards the fastener. Regardless of how quickly device 100 is moved over a wall surface, magnet element 128 snaps out of its resting position 131a and moves to the active position 131b, thereby indicating the presence of a fastener or other ferromagnetic object. Movement of magnet element 128 to the active position 131b indicates the presence of a ferromagnetic object by visual, audible, and tactile cues.

The user may use device 100 to locate ferromagnetic objects by holding device 100 against a surface. Device 100 indicates the presence of a magnetic object to the user in at least three ways. When device 100 passes over a ferromagnetic object, magnet element 128 snaps against front end 114 of device 110 to indicate the location visibly, audibly or by the vibration caused by the snap action. The user may see magnet element 128 move from the resting position 131a to active position 131b by viewing its position through housing 102. The user also may receive an audible signal when magnet element 128 snaps against front end 114 of device 100. The user also may feel the vibration of magnet element 128 moving from resting position 131a to active position 131b as a result of the snap action.

Device 100 may be used on any plane because the magnetic attractive force to maintain the resting position is sufficient to overcome the force of gravity when front end 114 of device 100 faces the ground. Similarly, magnetic attraction of magnet element 128 to a fastener is sufficient to overcome both gravity and attractive forces to the ferromagnetic member 126 when device 100 faces upward.

At each fastener location a mark may be made so the user may recall the precise location of the fastener. As device 100 is used to find more fasteners, and marks are made at each location, a map of each stud or other support member will become apparent to the user. The virtue of this mapping is that even if unconventional construction techniques were used, such as non-standard spacing of structural elements or structural members that do not run the full length of a wall, the user will know the location of the structural members. This method contrasts the subjective operation of other detectors and, for example, the assumption that studs are placed sixteen inches on center.

Various embodiments of device 100 may be used to detect ferromagnetic fasteners or objects through tile, drywall, or plaster and lath, for example. The magnet(s) in device 100 may be chosen in size to facilitate detection of ferromagnetic fasteners to different depths. For example, a consumer version of device 100 may be configured for detecting ferromagnetic fasteners through ⅝" of gypsum drywall. Optionally, another version of device 100 may be configured for detection of fasteners through 1½ inches or more of drywall or other wall covering material. The size of the magnet(s) may also be tailored to target detection of fasteners of a specific minimum size.

In an alternate embodiment, the magnet element 128 is retained in its resting position with a spring 200 (not shown), ligand 202 (not shown), or pneumatic pressure. For example, a metal coil spring 200 attached between magnet element 128 and rear surface 122 of housing 102 would provide a spring force sufficient to maintain the resting position of magnet element 128 against stop element 124. In such a design spring 200 and magnet element 128 should be chosen to provide the desired offsetting forces and necessary attractive force between magnet element 128 and a fastener to achieve the ability to detect fasteners at a chosen depth within a wall. This configuration is not limited to coil springs or metal springs; other types of springs 200 and materials could be used depending on the desired physical properties.

An elastic material 202 (not shown), such as a tendon or ligand 202 may be used in place of, or in conjunction with, spring 200. Similar to the spring configuration, tendon 202 in this configuration may connect between the rear surface 122 of housing 102 and magnet element 128. Similar to spring 200, the elasticity of tendon 202 provides the force to maintain the magnet element 128 in the resting position 131a. The attraction of magnet element 128 to a fastener pulls magnet element 128 to the active position 131b and deforms tendon 202. When device 100 is moved away from the fastener, the elasticity of tendon 202 provides the force that returns tendon 202 to its original shape and returns magnet element 128 to the resting position 131a. Because a spring's force increases linearly with distance, the spring 200 and magnet element 128 combination should be chosen so that the force of magnetic attraction to a fastener is sufficient to create rapid acceleration towards front end 114 of device 100 in spite of the spring's counter-acting force at its extended position.

In yet another alternate embodiment, device 100 may be configured as a pneumatic cylinder 204 (not shown) or piston. In this configuration, a portion of magnet element 128 forms an air-tight seal with interior wall surface 110 of housing 102. Vacuum grease may also be used to aid in forming the seal and facilitating low-friction movement of magnet element 128 within chamber 104. Depending on the materials used to construct housing 102, an O-ring (not shown) may be used around the perimeter of magnet element 128 to form a seal with the interior wall surface 110 of housing 102. In this configuration, air sealed within the rear portion 104b of chamber 104 of the housing 102 results in equilibration forces that maintain the magnet element 128 in resting position 131a until device 100 is placed over a fastener.

The pneumatic force that retains magnet element 128 in resting position 131a increases as magnet element 128 moves towards the front end 114 of device 100. The pressure inside rear portion 104b of chamber 104 decreases because the volume of the rear portion 104b increases. As a result, the dimensions of the chamber 104 should be chosen in combination with the magnet in magnet element 128 to achieve the desired acceleration of the magnet element 128 towards a ferromagnetic object.

When the magnet element 128 is located over a fastener, the magnetic attractive force overcomes the force created by the pressure differential created between the gas sealed within the rear portion 104b of housing 104 and the atmospheric pressure as the magnet element 128 moves towards the front 114 of housing 102 to its active position 131b. When magnet element 128 moves from its resting position to its active position, the volume of the air chamber 104b expands, creating a low-pressure condition within the housing 102. The pressure differential provides the force needed to return the magnet element 128 to its resting position when the device 100 is moved away from a fastener.

To set the location of the magnet element 128 in the resting position, the housing 102 may optionally feature air relief valve 206 (not shown) or re-sealable opening 207 (not shown). When valve 206 or opening 207 is open to the atmosphere, the user may position the magnet at the desired position in housing 102. The user may then close valve 206 or opening 207 to the atmosphere, thereby creating the pneumatic chamber 104*b*.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A device for locating a ferromagnetic object, the device comprising:
    a non-magnetic housing with a front surface, a rear surface, and a perimeter wall defining a chamber within the housing;
    at least one stop element located in the chamber between the front surface and the rear surface;
    a magnet element housed within the chamber between the at least one stop element and the front surface, the magnet element reversibly movable between a first position, wherein the magnet element is proximate the at least one stop element, and a second position, wherein the magnet element is proximate the front surface; and
    a mechanism for returning the magnet element to the first position in the absence of the ferromagnetic object located proximate the front surface, wherein the mechanism is a pneumatic force and is caused by a pressure differential between ambient and a portion of the chamber between the magnet element and the rear surface, the pressure differential resulting from movement of the magnet element towards the second position.

2. A device for locating a ferromagnetic object, the device comprising:
    a non-magnetic housing with a front surface, a rear surface, and a perimeter wall defining a chamber within the housing;
    at least one stop element located in the chamber between the front surface and the rear surface;
    a magnet assembly housed within the chamber between the at least one stop element and the front surface and comprising a magnet holder and a magnet attached to the magnet holder, wherein the magnet assembly is reversibly movable between a first position, wherein the magnet assembly is proximate the at least one stop element, and a second position, wherein the magnet assembly is proximate the front surface;
    a mechanism for returning the magnet element to the first position in the absence of the ferromagnetic object located proximate the front surface;
    at least one sloping surface extending along the perimeter wall of the housing and spiraling forward towards the front surface; and
    at least one leg on the magnet assembly for engaging the at least one sloping surface, thereby causing the magnet assembly to rotate about a central longitudinal axis of the housing as the magnet assembly moves between the first position and the second position.

\* \* \* \* \*